(12) United States Patent
Jang et al.

(10) Patent No.: US 12,301,223 B2
(45) Date of Patent: May 13, 2025

(54) POWER SUPPLY SWITCH CIRCUIT AND OPERATING METHOD THEREOF

(71) Applicant: SAMSUNG ELECTRO-MECHANICS CO., LTD., Suwon-si (KR)

(72) Inventors: Youngwong Jang, Suwon-si (KR); Jeonghoon Kim, Suwon-si (KR); Jongok Ha, Suwon-si (KR); Shinichi Iizuka, Suwon-si (KR); Hyejin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 246 days.

(21) Appl. No.: 17/858,643

(22) Filed: Jul. 6, 2022

(65) Prior Publication Data

US 2023/0038876 A1    Feb. 9, 2023

(30) Foreign Application Priority Data

Aug. 6, 2021 (KR) .................. 10-2021-0104126

(51) Int. Cl.
*H03K 17/687* (2006.01)
*H03K 17/16* (2006.01)
*H03K 19/00* (2006.01)
*H03K 19/20* (2006.01)

(52) U.S. Cl.
CPC ....... *H03K 17/6871* (2013.01); *H03K 17/162* (2013.01); *H03K 19/0016* (2013.01); *H03K 19/20* (2013.01)

(58) Field of Classification Search
CPC ............. H03K 17/6871; H03K 17/162; H03K 19/0016; H03K 19/20
See application file for complete search history.

(56) References Cited

U.S. PATENT DOCUMENTS

| | | | |
|---|---|---|---|
| 7,973,595 B2 | 7/2011 | Kimura | |
| 11,009,902 B1 | 5/2021 | Miwa et al. | |
| 11,073,857 B1* | 7/2021 | Liberti | ............... H03K 17/6871 |
| 2011/0074376 A1* | 3/2011 | Chen | ........................ H03F 3/217 323/283 |
| 2017/0346299 A1* | 11/2017 | Sridhar | ................ G06F 1/3296 |

FOREIGN PATENT DOCUMENTS

| | | |
|---|---|---|
| EP | 3 465 913 B1 | 3/2021 |
| JP | 10215212 A * | 8/1998 |

* cited by examiner

*Primary Examiner* — Lincoln D Donovan
*Assistant Examiner* — James G Yeaman
(74) *Attorney, Agent, or Firm* — NSIP Law

(57) ABSTRACT

A power source switch circuit and an operation method thereof are provided. The power source switch circuit may include a switch circuit that includes a first switch configured switch a supply of a voltage from a first power supply circuit to a power supply terminal of a power amplifier, and a second switch configured to switch a supply of a voltage from a second power supply circuit to the power supply terminal of the power amplifier; and a switch controller configured to control the switch circuit to set the first switch and the second switch in a turned-on state during a first period when the first switch is turned off and the second switch is turned on.

19 Claims, 12 Drawing Sheets

FIG. 4

| bit2 | bit1 | SW2_CTRL | SW1_CTRL | SW1 | SW2 |
|---|---|---|---|---|---|
| 0 | 0 | OFF | OFF | OFF | OFF |
| 0 | 1 | OFF | ON | OFF | ON |
| 1 | 0 | ON | OFF | ON | OFF |
| 1 | 1 | OFF | OFF | OFF | OFF |

FIG. 7

| bit2 | bit1 | $V_{LOG2}$ | $V_{LOG1}$ |
|------|------|------------|------------|
| 0 | 0 | 1 | 1 |
| 0 | 1 | 1 | 0 |
| 1 | 0 | 0 | 1 |
| 1 | 1 | 1 | 1 |

POWER SUPPLY SWITCH CIRCUIT AND OPERATING METHOD THEREOF

CROSS-REFERENCE TO RELATED APPLICATIONS

This application claims the benefit under 35 USC § 119(a) of Korean Patent Application No. 10-2021-0104126, filed on Aug. 6, 2021, in the Korean Intellectual Property Office the entire disclosure of which is incorporated herein by reference for all purposes.

BACKGROUND

1. Field

The following description relates to a power supply switch circuit and an operation method thereof.

2. Description of Related Art

As various wireless communication standards evolve, a plurality of communication standards such as 2G, Wi-Fi, Bluetooth, 3G, 4G, and 5G are implemented in a single device (e.g., a smartphone). As a plurality of communication standards are implemented in a device, a power amplifier that outputs a transmission signal may also be implemented for each communication standard. That is, in order to output a signal that conforms to the plurality of communication standards, a plurality of power amplifiers corresponding to the plurality of communication standards may have to be implemented.

The power amplifier operates by receiving a power supply from an external source, and typically, a separate power supply integrated circuit (IC) that supplies power to a single power amplifier may be implemented. In an example, four power supply ICs may be implemented to operate four power amplifiers. When one communication standard among the plurality of communication standards is implemented, the other communication standards may not be simultaneously used. In an example, when the 4G communication standard is implemented, the 3G communication standard may not be implemented. Accordingly, it would be beneficial if a power supply IC that corresponds to an unused communication standard is implemented for another communication standard.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power supply switch circuit includes a switch circuit, including a first switch configured to switch a supply of a voltage from a first power supply circuit to a power supply terminal of a power amplifier, and a second switch configured to switch a supply of a voltage from a second power supply circuit to the power supply terminal of the power amplifier; and a switch controller configured to control the switch circuit to set the first switch and the second switch in a turned-on state during a first period when the first switch is turned off and the second switch is turned on.

The controller may be configured to delay the turning-off of the first switch during the first period to maintain the turned-on state of the first switch.

During the first period, the voltage from the first power supply circuit and the voltage from the second power supply circuit may be simultaneously supplied to the power supply terminal of the power amplifier.

After the first period, the first switch may be set to the turned-off state and the second switch may be set to the turned-on state, and the voltage from the second power supply circuit is supplied to the power supply terminal of the power amplifier.

The switch controller may include a delay circuit configured to delay a first logic signal that controls the first switch and a second logic signal that controls the second switch.

The delay circuit may include a first delay circuit, comprising a first delay element configured to delay the first logic signal, and a first NAND gate configured to receive the first logic signal and a signal delayed by the first delay element; and a second delay circuit comprising a second delay element configured to delay the second logic signal, and a second NAND gate configured to receive the second logic signal and a signal delayed by the second delay element.

The first delay element and the second delay element may respectively include resistors and capacitors, and the first logic signal and the second logic signal are delayed in response to a time constant value determined by the resistors and the capacitors.

The switch controller may further include a logic circuit configured to generate the first logic signal and the second logic signal; and a buffer circuit configured to convert a driving control signal to drive the first switch and the second switch based on an output signal of the delay circuit.

The logic circuit may include a first NAND gate configured to receive a first bit to control the first switch, and a second bit to control the second switch; a second NAND gate configured to receive the first bit and an output of the first NAND gate and output the first logic signal; and a third NAND gate configured to receive the second bit and an output of the first NAND gate and output the second logic signal.

Each of the first switch and the second switch may include a P-type transistor and an N-type transistor that are coupled to each other in parallel.

The P-type transistor and the N-type transistor may be configured to be simultaneously turned on and simultaneously turned off.

In a general aspect a method includes supplying a voltage from a first power supply circuit to a power supply terminal of a power amplifier in a first period by turning on a first switch that switches the voltage from the first power supply circuit, and turning off a second switch that switches a voltage from a second power supply circuit; simultaneously supplying the voltage from the first power supply circuit and the voltage from the second power supply circuit in a second period by maintaining the turned-on state of the first switch and turning on the second switch; and supplying the voltage from the second power supply circuit to the power supply terminal of the power amplifier after the second period, by turning off the first switch and maintaining the turned-on state of the second switch.

In the second period, a logic signal that controls the turning-off of the first switch may be delayed for the second period.

The logic signal may be delayed for the second period by a capacitor, configured to generate an RC time constant, and a resistor.

In the second period, a voltage between the voltage of the first power supply circuit and the voltage of the second power supply circuit may be supplied to the power supply terminal of the power amplifier.

Each of the first switch and the second switch may include a P-type transistor and an N-type transistor that are coupled to each other in parallel.

In a general aspect, a power supply switch circuit includes a first switch configured to receive a first voltage from a first power supply circuit and switch a supply of the first voltage to a power amplifier; a second switch configured to receive a second voltage from a second power supply circuit and switch a supply of the second voltage to the power amplifier; and a switch controller configured to generate a switching control signal to overlap the supply of the first voltage and the second voltage to the power amplifier during a change in the supply of voltage from the first voltage to the second voltage, and a change in the supply of voltage from the second voltage to the first voltage.

The overlap may include delaying a turning-off of one of the first switch and the second switch during a first period to maintain a turned-on state of the one of the first switch and the second switch.

During the first period, the first voltage from the first power supply circuit and the second voltage from the second power supply circuit may be simultaneously supplied to the power amplifier.

Other features and aspects will be apparent from the following detailed description, the drawings, and the claims.

BRIEF DESCRIPTION OF DRAWINGS

FIG. 4 illustrates an example logic table, in accordance with one or more embodiments.

FIG. 7 illustrates an input-output logic table of the example logic circuit of FIG. 6.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
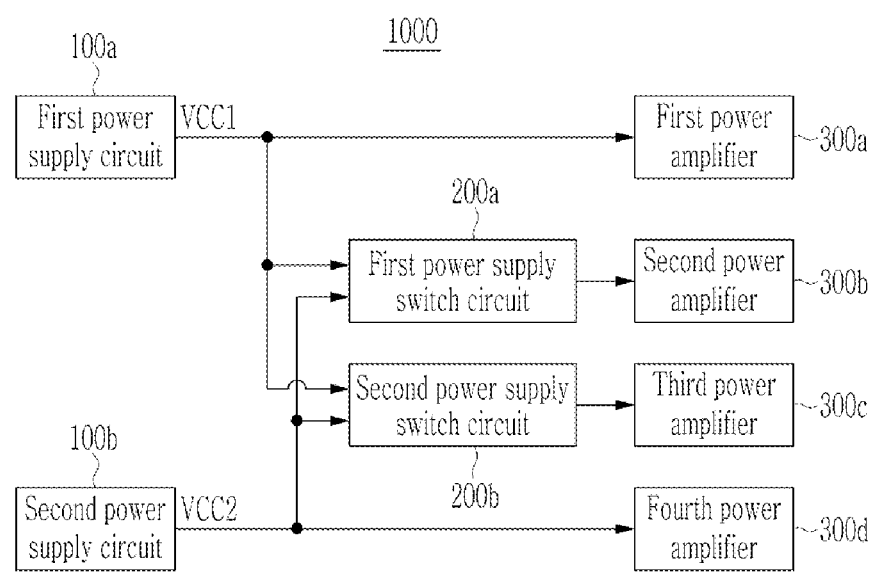
FIG. 1 illustrates a block diagram of an example transmission system, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Throughout the specification, radio frequency (RF) signals may have a format according to, but not limited to, Wi-Fi (IEEE 802.11 family, etc.), WiMAX (IEEE 802.16 family, etc.), IEEE 802.20, LTE (long term evolution), Evolution-Data Optimized (Ev-DO), High Speed Packet Access (HSPA), High Speed Downlink Packet Access (HSDPA), High Speed Uplink Packet Access (HSUPA), Enhanced Data GSM Environment (EDGE), Global System for Mobile Communication (GSM), Global Positioning System (GPS), General Packet Radio Service (GPRS), Code-division multiple access (CDMA), Time-division multiple access (TDMA), Digital Enhanced Cordless Telecommunication (DECT), Bluetooth, 3G, 4G, 5G, and any other wireless and wired protocols designated thereafter, but is not limited thereto.

FIG. 1 illustrates a block diagram of an example transmission system 1000, in accordance with one or more embodiments.

As illustrated in FIG. 1, an example transmission system 1000, in accordance with one or more embodiments, may include respective first and second power supply circuits 100a and 100b, respective first and second power supply switch circuits 200a and 200b, and respective first to fourth power amplifiers 300a to 300d.

In an example, FIG. 1 illustrates that the transmission system 1000 may be formed of four power amplifiers 300a to 300d, and two power supply switch circuits 100a and 100b may be connected to the four power amplifiers 300a to 300d. However, this is only an example, and the number of power amplifiers 300a to 300d and the number of power supply switch circuits 100a and 100b may be varied.

The first power supply circuit 100a may generate and output a first power source voltage VCC1. In an example, the first power source voltage VCC1 may be applied to a power supply terminal of the first power amplifier 300a, a second power amplifier 300b, or a third power amplifier 300c. In order to support an average power tracking mode (APT mode), a value of the first power source voltage VCC1 may be varied based on an envelope of a signal input to the first power amplifier 300a, the second power amplifier 300b, or the third power amplifier 300c.

The second power supply circuit 100b may generate and output a second power source voltage VCC2. In an example, the second power source voltage VCC2 may be applied to a power supply terminal of the second power amplifier 300b, the third power amplifier 300c, or the fourth power amplifier 300d. In order to support the APT mode, a value of the second power source voltage VCC2 may be varied based on an envelope of a signal input to the second power amplifier 300b, the third power amplifier 300c, or the fourth power amplifier 300d.

Each of the respective first and second power supply circuits 100a and 100b may be implemented as a power management Integrated Circuit (PMIC).

The first power supply switch circuit 200a may receive the first power source voltage VCC1 from the first power supply circuit 100a, and may receive the second power source voltage VCC2 from the second power supply circuit 100b. The first power supply switch circuit 200a may select one of the voltages input from the first power source voltage VCC1 and the second power source voltage VCC2, and output the selected voltage to the power supply terminal of the second power amplifier 300b. In an example, when the first power amplifier 300a does not operate, the first power supply switch circuit 200a may select the first power source voltage VCC1, and output the selected first power source voltage VCC1 to the power supply terminal of the second power amplifier 300b. Similarly, when the fourth power amplifier 300d does not operate, the first power supply switch circuit 200a may select the second power source voltage VCC2, and output the selected second power source voltage VCC2 to the power supply terminal of the second power amplifier 300b.

The second power supply switch circuit 200b may receive the first power source voltage VCC1 from the first power supply circuit 100a, and may receive the second power source voltage VCC2 from the second power supply circuit 100b. The second power supply switch circuit 200b may select one of the voltages input from the first power source voltage VCC1 and the second power source voltage VCC2, and output the selected voltage to the power supply terminal of the third power amplifier 300c. In an example, when the first power amplifier 300a does not operate, the second power supply switch circuit 200b may select the first power source voltage VCC1 and output the first power source voltage VCC1 to the power supply terminal of the third power amplifier 300c. Similarly, when the fourth power amplifier 300d does not operate, the second power supply switch circuit 200b may select the second power source voltage VCC2 and output the selected second power source voltage VCC2 to the power supply terminal of the third power amplifier 300c.

The first power amplifier 300a may operate by receiving the first power source voltage VCC1 from the first power supply circuit 100a, and may amplify and output an input radio frequency (RF) signal. The input RF signal of the first power amplifier 300a may be an RF signal for a first communication standard.

The second power amplifier 300b may operate by receiving the power source voltage (i.e., the first power source voltage VCC1 or the second power source voltage VCC2) selected by the first power supply switch circuit 200a, and may amplify and output an input RF signal. The input RF signal of the second power amplifier 300b may be an RF signal for a second communication standard.

The third power amplifier 300c operates by receiving the power source voltage (i.e., the first power source voltage VCC1 or the second power source voltage VCC2) selected by the second power supply switch circuit 200b, and may amplify and output the input RF signal. The input RF signal of the third power amplifier 300c may be an RF signal for a third communication standard.

The fourth power amplifier 300d may operate by receiving the second power source voltage VCC2 supplied from the second power supply circuit 100b, and may amplify and output an input RF signal. The input RF signal of the fourth power amplifier 300d may be an RF signal for a fourth communication standard.

In an example, the first to fourth communication standards may be different from each other, and may be any one of, but not limited to, 2G, WiFi, Bluetooth, 3G, 4G, and 5G communication standards. The first to fourth communication standards may be communication standards that define different bands among 5G communication standards.

In an example, the number of power supply circuits may be reduced by sharing the power source voltage through the power supply switch circuit. Typically, when there are four power amplifiers, four power supply circuits are used. However, in FIG. 1, the number of power supply circuits can be reduced to two by implementing a power supply switch circuit. Hereinafter, a detailed configuration and operation method of a power supply switch circuit such as the first and second power supply switch circuits 200a and 200b will be described.

Figure 2:
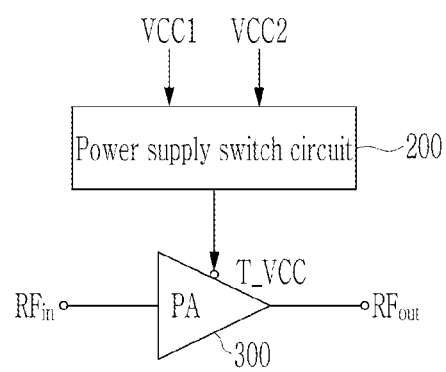
FIG. 2 illustrates a connection relationship between an example power supply switch circuit and an example power amplifier, in accordance with one or more embodiments.

FIG. 2 illustrates a connection relationship between an example power supply switch circuit 200 and an example power amplifier 300, in accordance with one or more embodiments.

The power supply switch circuit 200 may receive the first power source voltage VCC1 and the second power source voltage VCC2, and may select and output one of the first and second power source voltages VCC1 and VCC2 to a power supply terminal T_VCC of the power amplifier 300. The power supply switch circuit 200 may be equivalent to the first power supply switch circuit 200a or the second power supply switch circuit 200b as illustrated in FIG. 1, and the power amplifier 300 may be equivalent to the first power amplifier 300a, the second power amplifier 300b, or the third power amplifier 300c.

In FIG. 1 and FIG. 2, the power supply switch circuit 200 may receive two power source voltages. However, this is only an example, and the power supply switch circuit 200 may receive at least two power source voltages. The power supply switch circuit 200 may select one power source voltage among at least two power source voltages.

The power amplifier 300 may include an input terminal RFin, an output terminal RFout, and a power supply terminal T_VCC. The RF signal is input to the input terminal RFin, and the amplified signal is output to the output terminal RFout. A power source voltage (VCC1 or VCC2) may be applied to the power supply terminal T_VCC, and the power amplifier 300 may be operated by the applied power source voltage (VCC1 or VCC2). The power amplifier 300 may be implemented as a transistor. When the power amplifier 300 is implemented as a bipolar junction transistor (BJT), the input terminal RFin may be a base and the power supply terminal T_VCC may be a collector or an emitter. When the power amplifier 300 is implemented as a field effect transistor (FET), the input terminal RFin may be a gate and the power supply terminal T_VCC may be a drain or a source.

In an example, the power supply switch circuit 200 and the power amplifier 300 of FIG. 2 may be combined to implement a single power amplifier module.

Figure 3:
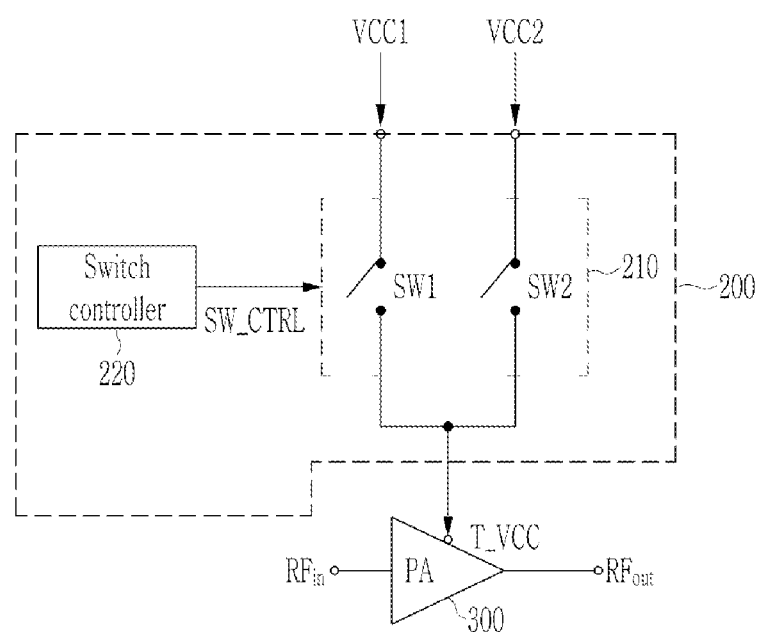
FIG. 3 illustrates an internal configuration of an example power source switch circuit of FIG. 2.

FIG. 3 illustrates an example internal configuration of the example power source switch circuit 200 of FIG. 2.

As illustrated in FIG. 3, the power supply switch circuit 200, in accordance with one or more embodiments may include a switch circuit 210 and a switch controller 220. The switch circuit 210 may include a first switch SW1 and a second switch SW2. The first switch SW1 may switch the supply of the first power source voltage VCC1 to the power supply terminal T_VCC of the power amplifier 300, and the second switch SW2 may switch the supply of the second power source voltage VCC2 to the power supply terminal T_VCC of the power amplifier 300. The first switch SW1 may be connected between the first power supply circuit 100a and the power supply terminal T_VCC of the power amplifier 300, and the second switch SW2 may be connected between the second power supply circuit 100b and the power supply terminal T_VCC of the power amplifier 300.

The switch controller 220 may receive a bit signal (digital signal) from an external source, and may generate a switching control signal SW CTRL to control switching operations of the switch circuit 210 in response to the input bit signal. The generated switching control signal SW CTRL is output to the switch circuit 210. In an example, the bit signal input from the external source may be 2 bits. The switching control signal SW CTRL may include a first switching control signal SW1_CTRL to control the first switch SW1, and a second switching control signal SW2_CTRL to control the second switch SW2.

When the first switching control signal SW1_CTRL is an ON control signal and the second switching control signal SW2_CTRL is an OFF control signal, the first switch SW1 is turned on (ON) and the second switch SW2 is turned off. Accordingly, the first power source voltage VCC1 is applied to the power supply terminal T_VCC of the power amplifier 300 through the first switch SW1.

When the first switching control signal SW1_CTRL is an OFF control signal and the second switching control signal SW2_CTRL is an ON control signal, the first switch SW1 is turned off and the second switch SW2 is turned on. Accordingly, the second power source voltage VCC2 is applied to the power supply terminal T_VCC of the power amplifier 300 through the second switch SW2.

The first switching control signal SW1_CTRL and the second switching control signal SW2_CTRL may not simultaneously be ON control signals. That is, an example in which the first and second switches SW1 and SW2 are simultaneously turned on can be prevented.

Referring to FIG. 4, even when a first bit signal is 1 and a second bit signal is also 1, the first and second switching control signals SW1_CTRL and SW2_CTRL may be OFF control signals. When the first and second switches SW1 and SW2 are simultaneously turned on, a current path may be formed from the first power supply circuit 100a to the second power supply circuit 100b or from the second power supply circuit 100b to the first power supply circuit 100a. Accordingly, the first power supply circuit 100a or the second power supply circuit 100b may be damaged. To prevent this, in an example, the first and second switches SW1 and SW2 may not be simultaneously turned on.

FIG. 4 illustrates a logic table, in accordance with one or more embodiments.

Referring to FIG. 4, bit1 and bit2 denote external bit signals input to the switch controller 220. As illustrated in FIG. 4, when the external bit signal is 00 and 11, both the first and second switching control signals SW1_CTRL and SW2_CTRL are OFF control signals, and the first and second switches SW1 and SW2 are both in a turn-off state. The switch controller 220 may include a logic circuit which has a logic table such as is illustrated in FIG. 4, which will be described in more detail below.

When the example power supply switch circuit 200 selects the first power source voltage VCC1 and applies the selected voltage to the power supply terminal T_VCC, but changes the selected voltage to the second power source voltage VCC2 and applies it to the power supply terminal T_VCC, a switching control signal may be generated to instantaneously overlap the two power source voltages VCC1 and VCC2. Additionally, when the power supply switch circuit 200 selects the second power source voltage VCC2 and applies it to the power supply terminal T_VCC, and changes it to the first power source voltage VCC1 and applies it to the power supply terminal T_VCC, the power supply switch circuit 200 may generate a switching control signal to instantaneously overlap the two power source voltages VCC1 and VCC2.

That is, the power supply switch circuit 200 may generate a control signal such that the power source voltage can be supplied to the power supply terminal T_VCC of the power amplifier 300 without interruption when switching between the two power source voltages. This is explained from the switch point of view below. On the other hand, when the first switch SW1 changes from the turn-on state to the turn-off state and the second switch SW2 changes from the turn-off state to the turn-on state, the switch controller 220 may delay the turn-off of the first switch SW1 such that a period in which the switch SW1 and the second switch SW2 are simultaneously turned on (hereinafter, referred to as a 'overlapping-on period') is created. Additionally, even when the second switch SW2 changes from the turn-on state to the turn-off state and the first switch SW1 changes from the turn-off state to the turn-on state, the switch controller 220 delays the turn-off of the second switch SW2 such that an overlapping-on period is created. Through the overlapping-on period, the power source voltage may be continuously provided to the power amplifier. When there is no overlapping-on period, the power source voltage is not supplied and thus the power amplifier 300 is turned off, and accordingly, a call drop may occur in an electronic device including the power amplifier 300. Accordingly, when the overlapping-on period is set as in the example, the call drop can be prevented.

In an example, the switch controller 220 may not generate the overlapping-on period, which is a period for simultaneously turning on the second switch SW2 when one switch (SW1 or SW2) is turned on in a state that both the first and second switches SW1 and SW2 are off (bit signal 00, 11).

In a non-limiting example, the first and second switches SW1 and SW2 may be implemented as P-type transistors or N-type transistors. When the first and second switches SW1 and SW2 are implemented as P-type transistors, the ON control signal may have a low voltage level (e.g., 0 V or a negative voltage), and the OFF control signal has a high voltage level (e.g., 3 V). When the first and second switches SW1 and SW2 are N-type transistors, the ON control signal may have a high voltage level (e.g., 3 V) and an OFF control signal may have a low voltage level (e.g., 0 V or a negative voltage).

Figure 5:
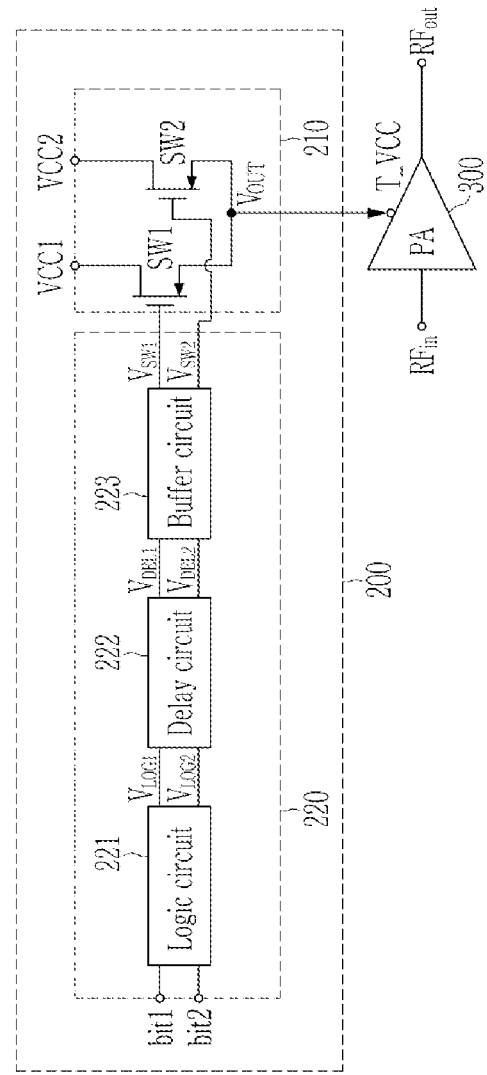
FIG. 5 illustrates an internal configuration of the example switch controller, in accordance with one or more embodiments.

FIG. 5 illustrates an internal configuration of the switch controller 220, in accordance with one or more embodiments.

Referring to FIG. 5, the switch controller 220, in accordance with one or more embodiments, may include a logic circuit 221, a delay circuit 222, and a buffer circuit 223. In FIG. 5, it is illustrated that the first and second transistors SW1 and SW2 are P-type transistors, but that is only an example, and they may be N-type transistors. In FIG. 5, a voltage that is transmitted to the power supply terminal T_VCC is denoted as $V_{OUT}$. Hereinafter, a voltage that is supplied by the switch circuit 200 to the power supply terminal T_VCC is called a power supply terminal voltage $V_{OUT}$.

The logic circuit 221 receives bit signal bit1 and bit signal bit2 from an external source, and generates and outputs logic signals $V_{LOG1}$ and $V_{LOG2}$ in response to the received bit signals bit1 and bit2. The first bit signal bit1 and the first logic signal $V_{LOG1}$ may be used to control the first switch SW1, and the second bit signal bit2 and the second logic signal $V_{LOG2}$ may be used to control the second switch SW2.

Figure 6:
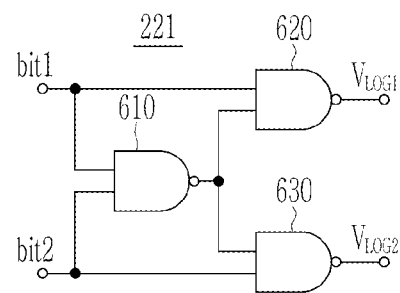
FIG. 6 illustrates an example logic circuit, in accordance with one or more embodiments.

FIG. 6 illustrates an example logic circuit 221, in accordance with one or more embodiments.

As illustrated in FIG. 6, the logic circuit 221, in accordance with one or more embodiments, may include a first NAND gate 610, a second NAND gate 620, and a third NAND gate 630.

The first NAND gate 610 may receive the first bit signal bit1 and the second bit signal bit2. The second NAND gate 620 may receive the first bit signal bit1 and an output of the first NAND gate 610, and output a first logic signal $V_{LOG1}$. Additionally, the third NAND gate 630 may receive the second bit signal bit2 and an output of the first NAND gate 610, and output a second logic signal $V_{LOG2}$.

Figure 7:
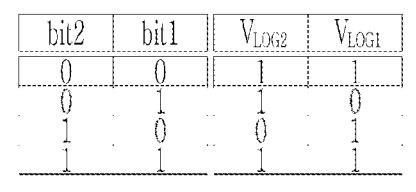

FIG. 7 illustrates an input-output logic table of the logic circuit 221 of FIG. 6.

Referring to FIG. 7, the logic circuit 221 may have four states corresponding to two bit signals. When the first logic signal $V_{LOG1}$ is 1, it implies a high-level state and the first switch SW1 is turned off. When the first logic signal $V_{LOG1}$ is 0, it implies a low-level state and the first switch SW1 is turned on. As described hereinbelow, the first and second logic signals $V_{LOG1}$ and $V_{LOG2}$ are inverted by a NAND gate of the delay circuit 222. Accordingly, the first and second switches SW1 and SW may be turned off at the high-level state of the first and second logic signals $V_{LOG1}$ and $V_{LOG2}$, and turned off at the low-level state of the first and second logic signals $V_{LOG1}$ and $V_{LOG2}$. That is, the first logic signal $V_{LOG1}$ becomes a low level at bit signal 01, and the first switch SW1 is turned on. Additionally, the second logic signal $V_{LOG2}$ becomes a low level at bit signal 10, and the second switch SW2 is turned on. In examples, the first and second logic signals $V_{LOG1}$ and $V_{LOG2}$ are at a high level, and the first and second switches SW1 and SW2 are both turned off.

The delay circuit 222 (FIG. 5) receives the first and second logic signals $V_{LOG1}$ and $V_{LOG2}$ from the logic circuit 221, and outputs delay signals $V_{DEL1}$ and $V_{DEL2}$ such that an overlapping-on period is generated during switching between the first switch SW1 and the second switch SW2. The first delay signal $V_{DEL1}$ corresponds to the first logic signal $V_{LOG1}$, and the second delay signal $V_{DEL2}$ corresponds to the second logic signal $V_{LOG2}$.

Figure 8A:
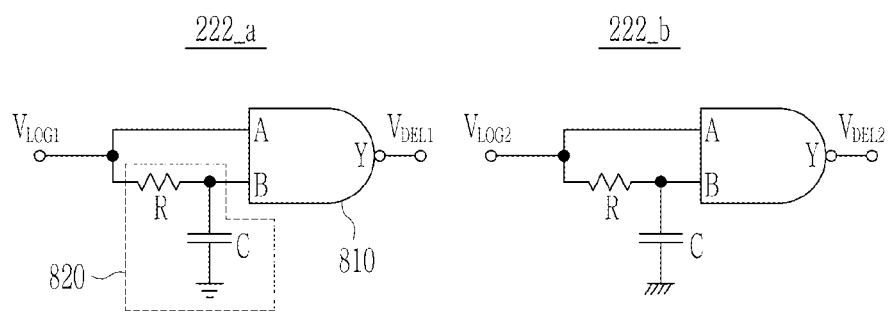
FIG. 8A illustrates an example delay circuit, in accordance with one or more embodiments.
Figure 8B:
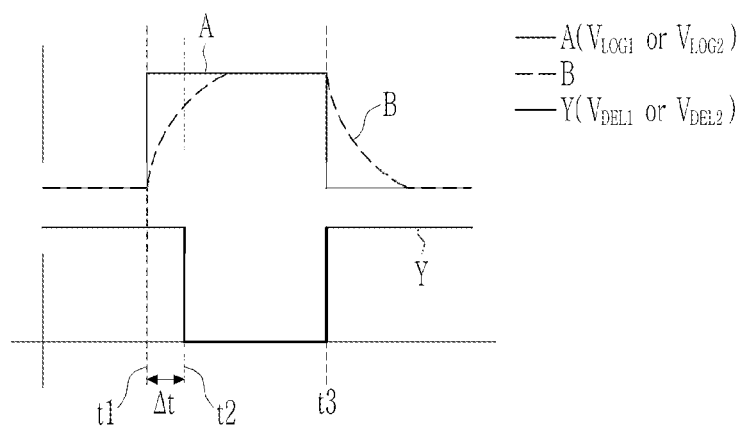
FIG. 8B illustrates a graph of an input-output signal timing of an example delay circuit, in accordance with one or more embodiments.

FIG. 8A illustrates an example delay circuit 222, in accordance with one or more embodiments, and FIG. 8B illustrates a graph depicting input-output signal timing of the delay circuit 222, in accordance with one or more embodiments.

As illustrated in FIG. 8A, the delay circuit 222 may include a first delay circuit 222_a and a second delay circuit 222_b.

The first delay circuit 222_a receives the first logic signal $V_{LOG1}$ and outputs a first delay signal $V_{DEL1}$. The first delay circuit 222_a may include a NAND gate 810 and a delay element 820. The delay element 820 may include a resistor R and a capacitor C connected to ground. In the first delay circuit 222_a, A and B denote input terminals of the NAND gate 810, and Y denotes an output terminal of the NAND gate 810. The first logic signal $V_{LOG1}$ is input to the input terminal A of the NAND gate 810. The capacitor C is connected between the input terminal B of the NAND gate 810 and the ground. The first logic signal $V_{LOG1}$ is input to one end of the resistor R, and the input terminal A of the NAND gate 810, and the other end of the resistor R is connected to the input terminal B of the NAND gate 810. In an example, the delay element 820 may delay the first logic signal $V_{LOG1}$ by a predetermined time, and output the delayed signal to the input terminal B of the NAND gate

810. A value of an RC time constant is determined by a value of the resistor R and a value of the capacitor C, and the signal may be delayed by the RC time constant value. On the other hand, the delay element 820 is a signal delay element, and may be implemented through other methods as well as through the resistor R and the capacitor C.

Referring to FIG. 8B, at time t1, the first logic signal $V_{LOG1}$ is changed to the high level from the low level (i.e., $V_{LOG1}$ is changed from 0 to 1). That is, at time t1, the first switch SW1 is changed from the turn-on state to the turn-off state. In this example, the input terminal A may immediately change from the low level to the high level, but the input terminal B is delayed by a predetermined time Δt by the delay element 820 and then changed from the low level to the high level. According to the operation characteristic of the NAND gate (low output only when both inputs are high and all others output high), the output terminal Y of the NAND gate 810 may be changed to a low level from a high level after a predetermined delay time Δt. Accordingly, when the first switch SW1 is changed from an ON state to an OFF state, the turn-off of the first switch SW1 is delayed by a predetermined delay time Δt.

At time t2, since both input terminals A and B of the NAND gate 810 are at a high level, the output terminal Y of the NAND gate 810 becomes a low level.

At time t3, the first logic signal $V_{LOG1}$ is changed from a high level to a low level (i.e., $V_{LOG1}$ is changed from 1 to 0). That is, at time t3, the first switch SW1 is changed from the turn-off state to the turn-on state. In this example, the input terminal A may immediately change from the high level to the low level, but the input terminal B may be delayed by a predetermined time by the delay element 820 and then changed from the low level to the high level. Accordingly, in view of the operation characteristic of the NAND gate (output high when only one of the two inputs is low), the output terminal Y of the NAND gate 810 may be immediately changed to the high level from the low level without a delay time.

That is, the first delay circuit 222_a may generate a delay of the output signal $V_{DEL1}$ only when the first logic signal $V_{LOG1}$ is changed from a low level to a high level, and may immediately generate an output signal without delay when the first logic signal $V_{LOG1}$ becomes the low level from the high level. When the first logic signal $V_{LOG1}$ is changed from a low level to a high level, the first switch SW1 is changed from the turned-on state to the turned-off state, and thus the first switch SW1 turns off after being delayed for a predetermined time. Additionally, when the first logic signal $V_{LOG1}$ is changed from a high level to a low level, the first switch SW1 is changed from the turned-off state to the turned-on state, and the first switch SW1 may be turned on immediately without delay.

The second delay circuit 222_b may receive a second logic signal $V_{LOG2}$ and output a second delay signal $V_{DEL2}$. As illustrated in FIG. 8A, the second delay circuit 222_b may have the same internal configuration as the first delay circuit 222_a except for receiving the second logic signal $V_{LOG2}$, and thus a redundant description will be omitted. The second delay circuit 222_b generates a delay of the output signal only when the second logic signal $V_{LOG2}$ is changed from a low level to a high level, and immediately generates an output signal when the second logic signal $V_{LOG2}$ is changed from a high level to a low level.

Due to the delay circuit 222, when switching between the first switch SW1 and the second switch SW2 is changed, an overlapping turn-on period that is a period in which the first and second switches SW1 and SW2 are simultaneously turned on may occur. For example, when the first switch SW1 is changed from the turn-on state to the turn-off state, the first switch SW1 is turned off as late as the RC time constant, thus resulting in a delayed turn-off time, and the second switch SW2 is turned on immediately without delay. Accordingly, the first and second switches SW1 and SW2 may be in a simultaneous turn-on state during the RC time constant. In an example, the RC time constant may correspond to the overlapping turn-on period. The overlapping turn-on period generated by the delay circuit 222 will be described below in more detail with reference to FIG. 9.

The buffer circuit 223 may receive the first and second delay signals $V_{DEL1}$ and $V_{DEL2}$ from the delay circuit 222, and output switching driving signals $V_{SW1}$ and $V_{SW2}$. The buffer circuit 223 converts a first delay signal $V_{DEL1}$ into a first switching driving signal $V_{SW1}$ and converts a second delay signal $V_{DEL2}$ into a second switching driving signal $V_{SW2}$. Since the first delay signal $V_{DEL1}$ and the second delay signal $V_{DEL2}$ are logic signals, and may have low current levels, the buffer circuit 223 converts the first delay signal $V_{DEL1}$ and the second delay signal $V_{DEL2}$ to the first switching driving signal $V_{SW1}$ and the second switching driving signal $V_{SW2}$ having a high current level, respectively. The first and second switching driving signals $V_{SW1}$ and $V_{SW2}$ correspond to the first and second switching control signals SW1_CTRL and SW2_CTRL described with reference to FIG. 3 and FIG. 4.

Since the first and second switches SW1 and SW2 may be P-type transistors, when the first and second switching driving signals $V_{SW1}$ and $V_{SW2}$ are low voltage (for example, 0 V or a negative (−) voltage), the first and second switches SW1 and SW2 may be turned on. Additionally, when the first and second switching driving signals $V_{SW1}$ and $V_{SW2}$ have a high voltage (e.g., 3 V), the first and second switches SW1 and SW2 may be turned off. Accordingly, in an example, the buffer circuit 223 may be implemented as an inverter buffer such that the delay signals $V_{DEL1}$ and $V_{DEL2}$ output a high voltage at a low level and output a low voltage when the delay signals $V_{DEL1}$ and $V_{DEL2}$ are at a high level.

Figure 9:
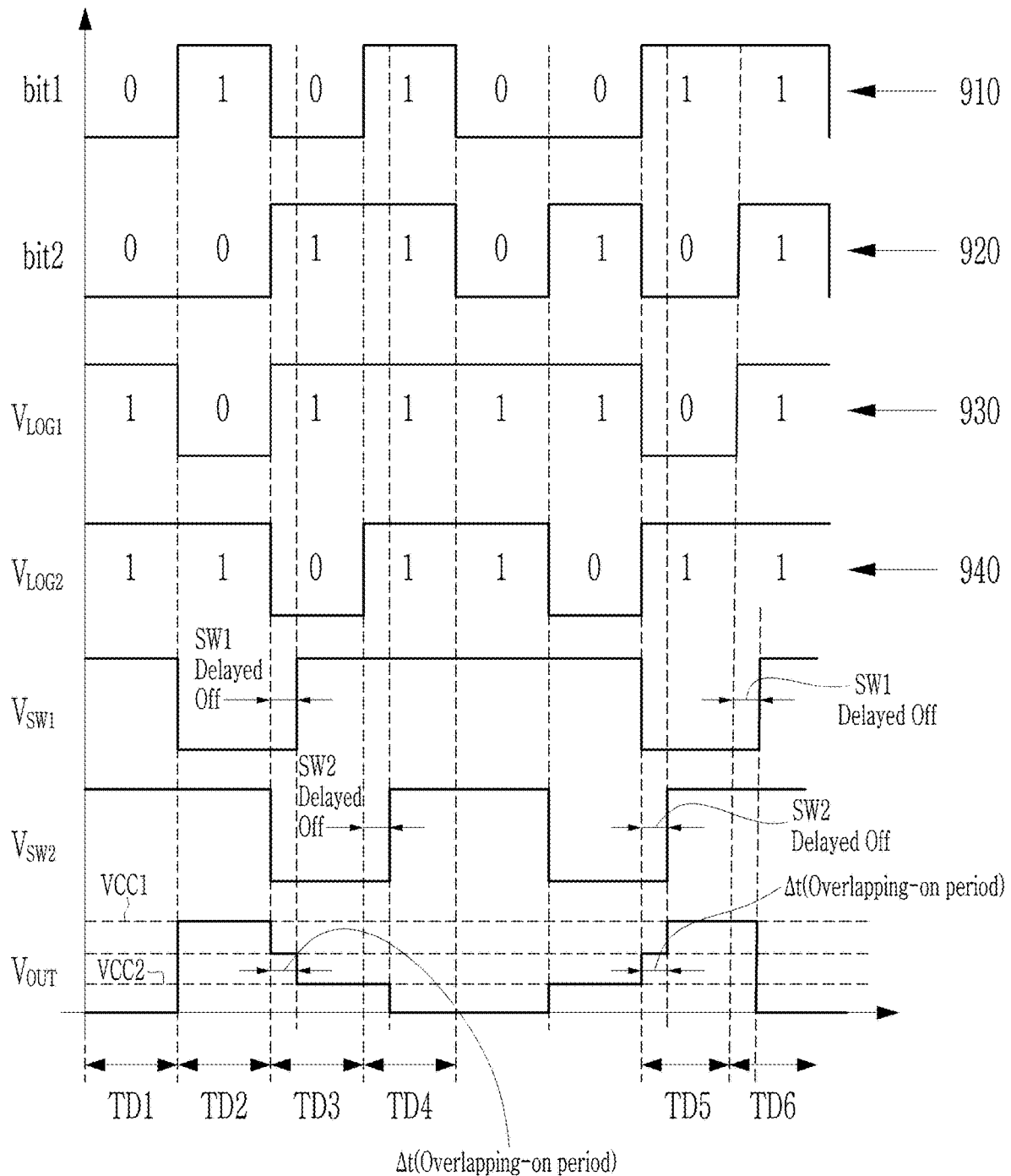
FIG. 9 illustrates an operation timing graph of an example power supply switch circuit, in accordance with one or more embodiments.

FIG. 9 illustrates an operation timing graph of the example power supply switch circuit 200, in accordance with one or more embodiments. FIG. 9 illustrates the first logic signal $V_{LOG1}$, the second logic signal $V_{LOG2}$, the first switching driving signal $V_{SW1}$, the second switching driving signal $V_{SW2}$, and the power supply terminal voltage $V_{OUT}$ according to first and second external bit signals bit1 and bit2.

When the first and second bit signals bit1 and bit2, for example, 910 and 920 are input, the logic circuit 221 outputs a first logic signal $V_{LOG1}$ for example, 930 and a second logic signal $V_{LOG2}$ for example, 940.

In a first period TD1, the first logic signal $V_{LOG1}$ is at a high level and the second logic signal $V_{LOG2}$ is also at a high level. In this example, the first and second switching driving signals VSW1 and VSW2 are both high voltages, and the first and second switches SW1 and SW2 are in the turned-off state. Accordingly, the power supply switch circuit 200 may not apply both power source voltages VCC1 and VCC2 as the power supply terminal voltage $V_{OUT}$.

In a second period TD2, the first logic signal $V_{LOG1}$ is at a low level and the second logic signal $V_{LOG2}$ is at a high level. In this example, the first switching driving signal $V_{SW1}$ is a low voltage and the second switching driving signal $V_{SW2}$ is a high voltage, the first switch SW1 is turned on and the second switch SW2 is turned off. Accordingly, the power supply terminal voltage $V_{OUT}$ becomes the first power source voltage VCC1.

In a third period TD3, the first logic signal $V_{LOG1}$ is at a high level and the second logic signal $V_{LOG2}$ is at a low level. That is, when the second period TD2 and the third period TD3 are considered together, the first logic signal $V_{LOG1}$ is changed from a low level to a high level. As previously described with reference to FIG. 8A and FIG. 8B, the delay circuit 222 may generate a delay of the output signal when the logic signal is changed from a low level to a high level (changed from 0 to 1). Since the first logic signal $V_{LOG1}$ is changed from a low level to a high level, the first delay circuit 222_a generates a delay of the output signal. Accordingly, since the first switching driving signal $V_{SW1}$ is changed from a low voltage to a high voltage after a predetermined delay time Δt, the turning-off of the first switch SW1 is delayed. In the third period TD3, the second switching driving signal $V_{SW2}$ is immediately changed from a high voltage to a low voltage without a delay time, and thus the second switch SW2 may be turned on immediately. That is, in the third period TD3, an overlapping-on period in which the first and second switches SW1 and SW2 are both turned-on occurs. Accordingly, the first power source voltage VCC1 and the second power source voltage VCC2 are simultaneously applied to the power supply terminal T_VCC, and the power supply terminal voltage $V_{OUT}$ is set as a voltage between the first power source voltage VCC1 and the second power source voltage VCC2. Meanwhile, in the third period TD3, after the predetermined delay time Δt, the first switch SW1 turns off and the second switch SW2 maintains the turned-on state, and thus the power supply terminal voltage $V_{OUT}$ becomes the second power source voltage VCC2.

In a fourth period TD4, the first logic signal $V_{LOG1}$ is at a high level and the second logic signal $V_{LOG2}$ is also at a high level. That is, when the third period TD3 and the fourth period TD4 are considered together, the second logic signal $V_{LOG2}$ is changed from a low level to a high level. As previously described with reference to FIG. 8A and FIG. 8B, the delay circuit 222 generates a delay of the output signal when the logic signal is changed from a low level to a high level (changed from 0 to 1). Since the second logic signal $V_{LOG2}$ is changed from a low level to a high level, the second delay circuit 222_b causes a delay of the output signal. Accordingly, since the second switching driving signal $V_{SW2}$ is changed from a low voltage to a high voltage after the predetermined delay time Δt, the turning-off of the second switch SW2 is delayed. In view of the turn-off delay of the second switch SW2, the power supply terminal voltage $V_{OUT}$ is maintained at the second power source voltage VCC2 for the predetermined delay time Δt.

In a fifth period TD5, the first logic signal $V_{LOG1}$ is at a low level and the second logic signal $V_{LOG2}$ is at a high level. That is, since the second logic signal $V_{LOG2}$ is a low level immediately before the fifth period TD5 and a high level in the fifth period TD5, the second logic signal $V_{LOG2}$ is changed from a low level to a high level at the beginning of the fifth period TD5. As described with reference to FIG. 8A and FIG. 8B, the delay circuit 222 generates a delay of the output signal when the logic signal is changed from a low level to a high level (changed from 0 to 1). Since the second logic signal $V_{LOG2}$ is changed from a low level to a high level, the second delay circuit 222_b causes a delay of the output signal. Accordingly, since the second switching driving signal $V_{SW2}$ is changed from a low voltage to a high voltage after the predetermined delay time Δt, the turning-off of the second switch SW2 is delayed. In the fifth period TD5, the first switching driving signal $V_{SW1}$ is immediately changed from high voltage to low voltage without a delay time, and thus the first switch SW1 is immediately turned on. That is, in the fifth period TD5, an overlapping-on period in which the first and second switches SW1 and SW2 are both turned-on occurs. Accordingly, the first power source voltage VCC1 and the second power source voltage VCC2 are simultaneously applied to the power supply terminal T_VCC, and the power supply terminal voltage $V_{OUT}$ is set to a voltage between the first power source voltage VCC1 and the second power source voltage VCC2. In an example, in the fifth period TD5, after the predetermined delay time Δt, the second switch SW2 is turned off and the first switch SW1 maintains the turned-on state, and thus the power supply terminal voltage $V_{OUT}$ becomes the first power source voltage VCC1.

In a sixth period TD6, the first logic signal $V_{LOG1}$ is at a high level, and the second logic signal $V_{LOG2}$ is also at a high level. That is, when the fifth period TD5 and the sixth period TD6 are considered together, the first logic signal $V_{LOG1}$ is changed from a low level to a high level. As described with reference to FIG. 8A and FIG. 8B, the delay circuit 222 generates a delay of the output signal when the logic signal is changed from a low level to a high level (changed from 0 to 1). Since the first logic signal $V_{LOG1}$ is changed from a low level to a high level, the first delay circuit 222_a causes a delay of the output signal. Accordingly, since the first switching driving signal $V_{SW1}$ is changed from a low voltage to a high voltage after the predetermined delay time Δt, the turning-off of the first switch SW1 is delayed. Due to the turn-off delay of the first switch SW1, the power supply terminal voltage $V_{OUT}$ is maintained at the first power source voltage VCC1 for the predetermined delay time Δt.

In the one or more examples, the power supply switch circuit 200 may change the first power source voltage VCC1 to the second power source voltage VCC2 to supply it to the power supply terminal T_VCC, and the power supply switch circuit 200 may simultaneously supply the power source voltages VCC1 and VCC2 to the power supply terminal for a predetermined time. That is, when the first switch SW1 is changed to the turned-off state and the second switch SW2 is changed to the turned-on state (for example, in the third period TD3 of FIG. 9), the overlapping-on period in which the first switch SW1 and the second switch SW2 are simultaneously turned on may be set. Additionally, the power supply switch circuit 200, in accordance with one or more embodiments, may also simultaneously supply the power source voltages VCC1 and VCC2 to the power supply terminal for a predetermined time when changing the second power source voltage VCC2 to the first power source voltage VCC1 and supplying it to the power supply terminal T_VCC. That is, when the first switch is changed to the turned-on state and the second switch is changed to the turned-off state (for example, in the fifth period TD5 of FIG. 9), the overlapping-on period in which the first switch SW1 and the second switch SW2 are simultaneously turned on may be set. In an example, when switching between the first switch SW1 and the second switch SW2 is changed, the power amplifier 300 can be prevented from being turned off by continuously supplying the power source voltage without interruption.

Figure 10:
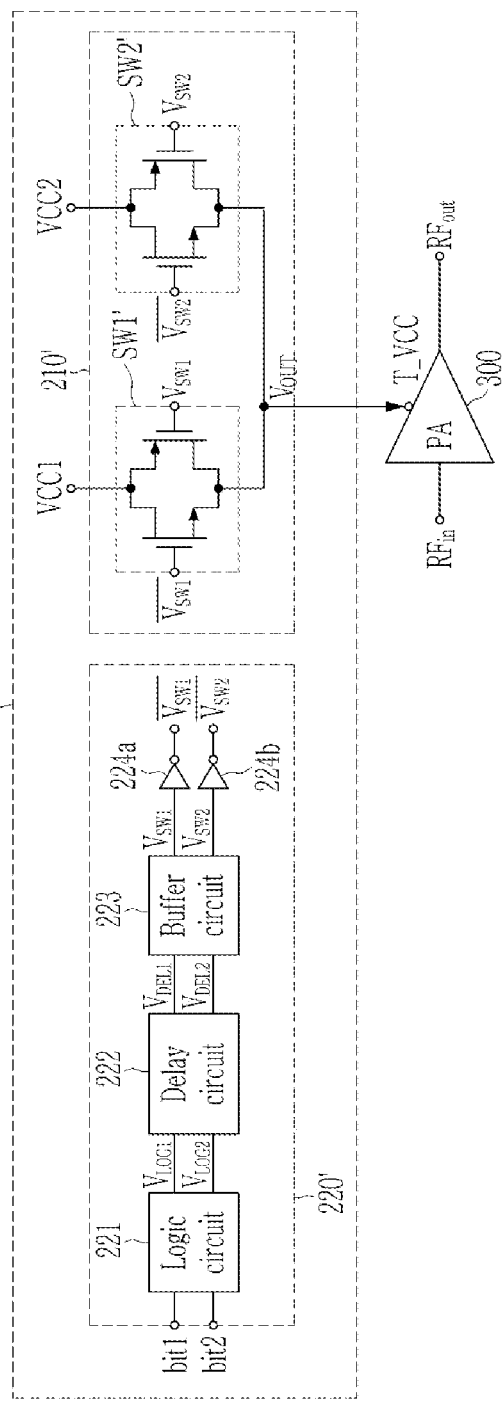
FIG. 10 illustrates an example power supply switch circuit, in accordance with one or more embodiments.

FIG. 10 illustrates a power supply switch circuit 200', in accordance with one or more embodiments.

As illustrated in FIG. 10, a power supply switch circuit 200', in accordance with one or more embodiments, may include a switch circuit 210' and a switch controller 220'.

In an example, the switch circuit 210' may include a first switch SW1' and a second switch SW2'. The first switch SW1' and the second switch SW2' may be formed of a P-type transistor and an N-type transistor coupled in parallel to each other, respectively. That is, the first switch SW1' may include a P-type transistor and an N-type transistor coupled in parallel with each other, and the second switch SW2' may also include a P-type transistor and an N-type transistor coupled in parallel with each other. In the first switch SW1', the drain of the N-type transistor and the source of the P-type transistor are coupled to each other and connected to a first power source voltage VCC1. Additionally, in the first switch SW1, a source of the N-type transistor and a drain of the P-type transistor are coupled to each other and connected to a power supply terminal T_VCC of the power amplifier 300. In the second switch SW2', a drain of the N-type transistor and a source of the P-type transistor are coupled to each other and connected to a second power source voltage VCC2. Additionally, in the second switch SW2, a source of the N-type transistor and the drain of the P-type transistor are coupled to each other and connected to the power supply terminal T_VCC of the power amplifier 300.

As previously described, the first and second power source voltages VCC1 and VCC2 may be changed according to an input RF signal envelope of a power amplifier 300 to support the APT mode. Accordingly, the first and second power source voltages VCC1 and VCC2 may have a wide voltage range. It may be beneficial to maintain switch turn-on resistance to be low even at a power source voltage with a wide voltage range, and for this, in FIG. 10, the first and second switches SW1' and SW2' may be formed of an N-type transistor and a P-type transistor coupled to a parallel structure.

Figure 11:
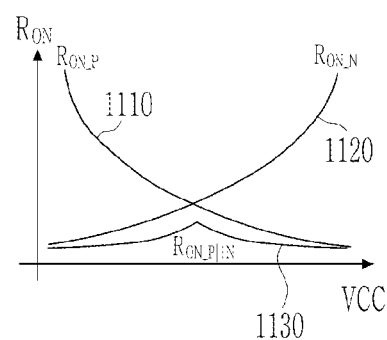
FIG. 11 illustrates a graph of a turn-on resistance $R_{ON}$ of an example transistor according to a power source voltage VCC, in accordance with one or more embodiments.

FIG. 11 is a graph that illustrates the turn-on resistance $R_{ON}$ of a transistor according to a power source voltage VCC.

In FIG. 11, graph 1110 indicates the turn-on resistance of a P-type transistor (e.g., a PMOS) according to a power source voltage VCC, and 1120 indicates the turn-on resistance of an N-type transistor (e.g., an NMOS) according to the power source voltage VCC.

Referring to graph 1110, the turn-on resistance of the P-type transistor increases as the power source voltage VCC decreases. That is, as illustrated in FIG. 5, when forming a switch with only P-type transistors, the turn-on resistance may be large at a low power source voltage VCC. Accordingly, the voltage drop appears high in the switch, and power consumption increases. In an example, referring to graph 1120, the turn-on resistance of the N-type transistor increases as the power source voltage VCC increases. That is, when a switch is formed only with an N-type transistor, the turn-on resistance may be large at a high power source voltage VCC.

In order to maintain low turn-on resistance even at a wide power source voltage, as illustrated in FIG. 10, in an example, the first and second switches SW1' and SW2' may be formed of an N-type transistor and a P-type transistor connected in a parallel structure. In FIG. 11, graph 1130 indicates a turn-on resistance according to the power source voltage VCC when the switch is formed of an N-type transistor and a P-type transistor coupled to each other in parallel. Referring to graph 1130, the turn-on resistance may be maintained low even at a wide power source voltage (input voltage). In an example, when the switches SW1' and SW2' are formed of a P-type transistor and an N-type transistor, the N-type transistor may mainly operate when the power source voltage (input voltage) is low, and the P-type transistor may mainly operate when the power source voltage is high.

As illustrated in FIG. 10, the switch controller 220', in accordance with one or more embodiments, may include a logic circuit 221, a delay circuit 222, a buffer circuit 223, a first inverter 224a, and a second inverter 224b. The switch controller 220' may be the same as the switch controller 220 illustrated in FIG. 5, and therefore duplicated description will be omitted.

The first inverter 224a may receive a first switching driving signal $V_{SW1}$ as an input, and output an inverted switching driving signal $\overline{V_{SW1}}$. The first switch driving signal $V_{SW1}$ may be input to a P-type transistor control terminal of the first switch SW1', and the inverted switching driving signal $\overline{V_{SW1}}$ may be input to an N-type transistor control terminal of the first switch SW1'. Accordingly, in the first switch SW1', the P-type transistor and the N-type transistor may be simultaneously turned on and simultaneously turned off.

The second inverter 224b may receive a second switching driving signal $\overline{V_{SW2}}$ as an input, and output an inverted switching driving signal $\overline{V_{SW2}}$. The second switch driving signal $V_{SW2}$ is input to a P-type transistor control terminal of the second switch SW2', and the inverted switching driving signal $\overline{V_{SW2}}$ is input to an N-type transistor control terminal of the second switch SW2'. Accordingly, in the second switch SW2', the P-type transistor and the N-type transistor are simultaneously turned on and simultaneously turned off.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power supply switch circuit, comprising:
   a switch circuit, comprising a first switch configured to switch a supply of a voltage from a first power supply circuit to a power supply terminal of a power amplifier, and a second switch configured to switch a supply of a voltage from a second power supply circuit to the power supply terminal of the power amplifier; and
   a switch controller configured to control the switch circuit to set the first switch and the second switch in a turned-on state to delay a turn-off of the first switch in an overlapping-on state of the first switch and the second switch during a first period when the first switch is turned off and the second switch is turned on.

2. The power supply switch circuit of claim 1, wherein the controller is configured to delay the turning-off of the first switch during the first period to maintain the turned-on state of the first switch.

3. The power supply switch circuit of claim 1, wherein:
   during the first period, the voltage from the first power supply circuit and the voltage from the second power supply circuit are simultaneously supplied to the power supply terminal of the power amplifier.

4. The power supply switch circuit of claim 1, wherein:
after the first period, the first switch is set to the turned-off state and the second switch is set to the turned-on state, and the voltage from the second power supply circuit is supplied to the power supply terminal of the power amplifier.

5. The power supply switch circuit of claim 1, wherein:
the switch controller comprises a delay circuit configured to delay a first logic signal that controls the first switch and a second logic signal that controls the second switch.

6. The power supply switch circuit of claim 5, wherein:
the delay circuit comprises:
a first delay circuit, comprising a first delay element configured to delay the first logic signal, and a first NAND gate configured to receive the first logic signal and a signal delayed by the first delay element; and
a second delay circuit comprising a second delay element configured to delay the second logic signal, and a second NAND gate configured to receive the second logic signal and a signal delayed by the second delay element.

7. The power supply switch circuit of claim 6, wherein:
the first delay element and the second delay element respectively comprise resistors and capacitors, and
the first logic signal and the second logic signal are delayed in response to a time constant value determined by the resistors and the capacitors.

8. The power supply switch circuit of claim 5, wherein:
the switch controller further comprises:
a logic circuit configured to generate the first logic signal and the second logic signal; and
a buffer circuit configured to convert a driving control signal to drive the first switch and the second switch based on an output signal of the delay circuit.

9. The power supply switch circuit of claim 8, wherein:
the logic circuit comprises:
a first NAND gate configured to receive a first bit to control the first switch, and a second bit to control the second switch;
a second NAND gate configured to receive the first bit and an output of the first NAND gate and output the first logic signal; and
a third NAND gate configured to receive the second bit and an output of the first NAND gate and output the second logic signal.

10. The power supply switch circuit of claim 1, wherein:
each of the first switch and the second switch comprises a P-type transistor and an N-type transistor that are coupled to each other in parallel.

11. The power supply switch circuit of claim 10, wherein:
the P-type transistor and the N-type transistor are configured to be simultaneously turned on and simultaneously turned off.

12. A method, comprising:
supplying a voltage from a first power supply circuit to a power supply terminal of a power amplifier in a first period by turning on a first switch that switches the voltage from the first power supply circuit, and turning off a second switch that switches a voltage from a second power supply circuit;
simultaneously supplying the voltage from the first power supply circuit and the voltage from the second power supply circuit in an overlapping-on state of the first switch and the second switch in a second period by maintaining the turned-on state of the first switch and turning on the second switch; and
supplying the voltage from the second power supply circuit to the power supply terminal of the power amplifier after the second period, by turning off the first switch and maintaining the turned-on state of the second switch.

13. The method of claim 12, wherein:
in the second period, a logic signal that controls the turning-off of the first switch is delayed for the second period.

14. The method of claim 13, wherein:
the logic signal is delayed for the second period by a capacitor, configured to generate an RC time constant, and a resistor.

15. The method of claim 12, wherein:
in the second period, a voltage between the voltage of the first power supply circuit and the voltage of the second power supply circuit is supplied to the power supply terminal of the power amplifier.

16. The method of claim 12, wherein:
each of the first switch and the second switch comprises a P-type transistor and an N-type transistor that are coupled to each other in parallel.

17. A power supply switch circuit, comprising:
a first switch configured to receive a first voltage from a first power supply circuit and switch a supply of the first voltage to a power amplifier;
a second switch configured to receive a second voltage from a second power supply circuit, and switch a supply of the second voltage to the power amplifier; and
a switch controller configured to generate a switching control signal to delay a turn-off of the first switch in an overlapping-on state of the first switch and the second switch to overlap the supply of the first voltage and the second voltage to the power amplifier during a change in the supply of voltage from the first voltage to the second voltage, and a change in the supply of voltage from the second voltage to the first voltage.

18. The power supply switch circuit of claim 17, wherein the overlap comprises delaying a turning-off of one of the first switch and the second switch during a first period to maintain a turned-on state of the one of the first switch and the second switch.

19. The power supply switch of claim 18, wherein during the first period, the first voltage from the first power supply circuit and the second voltage from the second power supply circuit are simultaneously supplied to the power amplifier.

* * * * *